(12) United States Patent
Choi et al.

(10) Patent No.: US 7,276,326 B2
(45) Date of Patent: Oct. 2, 2007

(54) METHOD FOR MANUFACTURING ORGANIC ELECTROLUMINESCENCE DISPLAY

(75) Inventors: Kyung Hee Choi, Seoul (KR); Byung Hyun Byun, Seoul (KR); Seung Jun Yi, Seoul (KR)

(73) Assignee: Daewoo Electronics Corporation, Mapo-gu, Seoul (KR)

( * ) Notice: Subject to any disclaimer, the term of this patent is extended or adjusted under 35 U.S.C. 154(b) by 0 days.

(21) Appl. No.: 11/431,590

(22) Filed: May 11, 2006

(65) Prior Publication Data
US 2006/0204903 A1 Sep. 14, 2006

Related U.S. Application Data

(63) Continuation of application No. PCT/KR2005/004064, filed on Nov. 30, 2005.

(30) Foreign Application Priority Data
Nov. 30, 2004 (KR) .................... 10-2004-0099179

(51) Int. Cl.
*H01J 9/227* (2006.01)

(52) U.S. Cl. .................... 430/321; 430/319; 430/330; 430/394

(58) Field of Classification Search .................... None
See application file for complete search history.

(56) References Cited

U.S. PATENT DOCUMENTS

| 6,221,563 B1* | 4/2001 | Hryhorenko et al. ....... 430/315 |
| 2006/0003266 A1* | 1/2006 | Yi et al. ...................... 430/320 |

* cited by examiner

*Primary Examiner*—John A. McPherson
(74) *Attorney, Agent, or Firm*—Bacon & Thomas PLLC

(57) ABSTRACT

A method for manufacturing an organic electroluminescence display includes forming a plurality of first electrodes on a substrate in a shape of stripe; forming a photoresist layer on an entire surface of the substrate; performing a first exposure of a first area on the photoresist layer crossing the first electrodes; carrying out an image reversal of the first exposed photoresist layer; performing a second exposure of a remaining area on the photoresist layer except a second area crossing the first electrodes and a third area between the first electrodes; performing a third exposure of the entire surface of the photoresist layer; and developing the second exposed photoresist layer and the third exposed photoresist layer.

21 Claims, 7 Drawing Sheets

METHOD FOR MANUFACTURING ORGANIC ELECTROLUMINESCENCE DISPLAY

This application is a Continuation Application of PCT International Application No. PCT/KR2005/004064 filed on Nov. 30, 2005, which designated the United States.

FIELD OF THE INVENTION

The present invention relates to a method for manufacturing an organic electroluminescence display through a simplified manufacturing process.

BACKGROUND OF THE INVENTION

In general, an organic electroluminescence (hereinafter referred to as an EL) display is one of flat plate type displays. The organic EL display includes an anode layer and a cathode layer formed on a transparent substrate, and an organic light-emitting layer is interposed between the anode layer and the cathode layer. The organic EL display has very thin thickness and it is fabricated as a matrix pattern.

Such an organic EL display is driven at a low voltage not greater than 15 Volts, and it exhibits advanced characteristics in terms of brightness, viewing angle, response time, power consumption, and so forth, compared to other types of displays, for example, a TFT-LCD. Besides, the organic EL display has a response time of about 1 µs, which is much faster than other displays, and, therefore, it is suitable for use in a next-generation multimedia display to which a function of implementing motion pictures is essential.

Fabrication of the organic EL display includes in general the steps of coating an insulating layer and a separator, both of which are made of an electrically insulating material, in order on a substrate on which an anode layer is formed and patterning an organic light-emitting layer and a cathode layer through an overhang structure of the separator.

Here, the insulating layer is formed on the entire surface of the anode layer except on dot-shaped openings defining pixels, and the insulating layer serves to prevent a leakage of a current at an edge portion of the anode layer.

Moreover, the separator formed on the insulating layer is arranged in a predetermined interval such that it crosses the anode layer. Further, the separator is configured to have an overhang structure with a negative profile, and it functions to separate the cathode layer between neighboring pixels.

Accordingly, both the insulating layer and the separator are necessary for a stable fabrication of the organic EL display.

For the reason, there have been proposed various methods for manufacturing an organic EL display by forming an insulating layer and a separator through a simplified process.

First of all, disclosed in U.S. Pat. No. 5,701,055 (hereinafter referred to Reference 1) is a manufacturing method for an organic EL display, in which an exposure and a developing process are conducted for each of two layers of photoresist layer, to thereby form an insulating layer and a separator individually.

In the method disclosed in Reference 1, an anode layer made of, e.g., an indium tin oxide (ITO), is formed on a transparent substrate in the shape of parallel stripes. Then, an insulating layer formed of, e.g., a positive photoresist layer is coated on the substrate on which the anode layer is provided.

Thereafter, the insulating layer is patterned through a photolithography process including an exposure process and a developing process such that it remains only on areas between the anode stripes and also on areas crossing the anode stripes. As a result, the insulating layer is patterned such that it exists on the entire surface of the anode layer except on dot-shaped openings patterned on the anode layer. That is to say, the insulating layer is patterned to have a lattice structure. Here, the openings define pixels of the organic EL display.

Afterward, a negative photoresist layer or the like is coated on the insulator pattern, and a separator with a negative profile is obtained by patterning the negative photoresist layer through a photolithography process including an exposure and a developing processes. At this time, the separator is arranged on the insulator pattern formed between the dot-shaped openings to cross the anode stripes, are configured to maintain a predetermined internal therebetween. Further, the separators have an overhang structure with a negative profile to allow a cathode layer, which is to be formed later, to prevent from occurring a short-circuit due to the connection to neighboring pixels. That is to say, the separator is formed to maintain a negative profile by using a characteristic of the negative photoresist layer. Therefore, a short circuit between cathode layers of neighboring pixels can be prevented.

Afterward, an organic light-emitting layer and a cathode layer are sequentially deposited on the resultant structure having the separators by using a metal mask. In this connection, when the organic light-emitting layer is deposited on the anode layer in the openings, there is a likelihood that the thickness of the organic light-emitting layer is reduced near the separator because of a shadow effect due to the separator, thus causing a short circuit between the cathode layer deposited on top of the organic light-emitting layer and the underneath anode layer. However, this problem is prevented by the presence of the insulating layer with a positive profile that is formed below the separator.

In accordance with the method disclosed in Reference 1 described so far, a reliable organic EL display can be fabricated by defining pixels and patterning an organic light-emitting layer and a cathode layer by using an insulating layer and a separator that are formed individually. In the conventional method in Reference 1, however, the photolithography process needs to be performed two times to form the insulating layer and the separator individually. Therefore, the manufacturing process for the organic EL display becomes complicated and manufacturing costs increases. Furthermore, since the insulating layer and the separator are respectively formed on top of each other as separate layers, adhesiveness therebetween may be weak. Thus, in case a ratio of width to height of a device isolation structure including the insulating layer and the separator decreases, the device isolation structure may be broken.

Since the method described in Reference 1 has such problems as mentioned above, there has been a demand for a further advanced method for fabricating an organic EL display by forming both an insulating layer and a separator as a single layer through a simplified manufacturing process.

Korean Patent No. 408,091 (hereinafter referred to as Reference 2) discloses one of such methods.

The method described in Reference 2 involves forming an insulating layer and a negative-profile trench serving as a separator through patterning an image-reversal photoresist layer of a single layer by performing an exposure process two times, and also performing an exposure process one time and a developing process two times using a half tone mask. Detailed description of the method will be provided below.

As in the method described in Reference 1, an anode layer made of, e.g., an ITO is formed on a transparent substrate in the shape of a plurality of parallel stripes. Then, an image-reversal photoresist layer is coated on the transparent substrate on which the anode layer is provided. Thereafter, a first exposure process using a half tone mask and a developing process are performed, whereby the image-reversal photoresist layer is patterned such that it only remains areas between the anode stripes and areas crossing the anode stripes. Thus patterned photoresist layer becomes to exist on the entire surface of the anode layer except on dot-shaped openings. That is, the photoresist layer has a lattice structure, and the openings define pixels.

Meanwhile, in the patterning step using the half tone mask, the image-reversal photoresist layer between the anode stripes is firstly exposed through a half tone pattern of the half tone mask and becomes to have a thinner thickness than its other areas crossing the anode stripes.

Thereafter, the image-reversal photoresist layer crossing the anode stripes is secondarily exposed to light through an exposure mask that shields the trench regions which is to serve as a separator. Then, an image-reversal baking process and a third exposure process (a flood exposure process) are performed to change the property of the image-reversal photoresist layer. Due to the characteristic of the image-reversal photoresist layer, during the image-reversal baking process, the portions of the photoresist layer secondarily exposed to light are cross-linked and still remain after a second developing process without being affected by the entire surface exposure process. Further, the image-reversal photoresist layer present in the trench regions, which is not exposed to light during the second exposure process, maintains its inherent property of the positive photoresist layer, and thus is removable during the second developing process which will be performed after the entire surface exposure process.

If the second developing process is conducted afterward, a negative-profile trench with an overhang structure is formed on the area of the photoresist layer crossing the anode stripes, wherein the trench serves to as a separator.

In accordance with the manufacturing method as described above, an insulating layer for defining pixels can be formed by using the image-reversal photoresist layer and, at the same time, a trench serving as a separator can be formed on the portions of the insulting layer crossing the anode stripes.

The subsequent processes for forming an organic light-emitting layer and a cathode layer are identical to those described in Reference 1, and therefore, detailed description thereof will be omitted.

In accordance with the manufacturing method disclosed in Reference 2, both an insulating layer and a trench serving as a separator can be formed by using an image-reversal photoresist layer of a single layer and a half tone mask. Therefore, the manufacturing method in Reference 2 is simpler than the method of Reference 1, and, also, the problem of adhesion between the insulating layer and the separator can be improved.

The method in Reference 2, however, also has disadvantages in that manufacturing costs for the organic EL display increases greatly as a result of using the half tone mask of a high price. Furthermore, design of the half tone mask is very difficult, and the manufacturing process is still complicated because the exposure step and the developing step should be performed three times and two times, respectively, to form the insulating layer and the trenches serving as the separators.

Besides, theoretically, though a remainder of the image-reversal photoresist layer other than its portions where the trenches are to be formed, i.e., the insulating layer needs to be cross-linked completely by the image-reversal baking not to be affected by the entire surface exposure process and the second developing process, some of the edge portions of the insulating layer may not be cross-linked completely by the image-reversal baking and thus can be removed during the second developing process. In particular, as for the insulating layer in which trenches are formed, if a part of the edge portions of the insulating layer adjacent to pixels is removed by being affected by the entire surface exposure and the second developing process, the inclined angle of the positive profile of the insulating layer will increase close to a right angle. As a consequence, the thickness of an organic light-emitting layer near the edge portion of the insulating layer will be reduced during the subsequent processes forming the organic light-emitting layer and a cathode layer, resulting in a short circuit between the cathode layer and the underneath anode layer.

Therefore, there has been a demand for still another method for manufacturing an organic EL display, while solving the above-mentioned problems. The Application of PCT/KR2004/002366 (hereinafter referred to as Reference 3) filed by the inventors of the present invention provides a method capable of solving some of theses problems of the conventional methods. In the method disclosed in Reference 3, an insulating layer and a separator is formed by patterning an image-reversal photoresist layer of a single layer by way of performing an exposure process and a developing process three and two times, respectively, by means of using a general exposure mask. Detailed description of this method will be provided hereinafter.

As similar as in the methods in Reference 1 and Reference 2, an anode layer made of, e.g., an ITO is formed on a transparent substrate in the shape of a plurality of parallel stripes. Then, an image-reversal photoresist layer is coated on the transparent substrate on which the anode layer is patterned. Thereafter, a first exposure and developing process is conducted by using a general exposure mask, to thereby perform a patterning of the image-reversal photoresist layer such that the photoresist layer only remains between the anode layers and on certain areas crossing the anode layers.

Afterward, the image-reversal photoresist layer is subjected to a second exposure thorough the use of an exposure mask for defining a region on which a separator will be formed. Then, the image-reversal photoresist layer is undergone through an image-reversal baking process, through which the characteristic of the image-reversal photoresist layer is changed. Subsequently, a flood exposure process (a third exposure process) is conducted. Due to the characteristic of the image-reversal photoresist layer, during the image-reversal baking process, a portion of the photoresist layer secondarily exposed to light, where the separator will be formed, is cross-linked and is left even after a second developing process without being affected by the entire surface exposure. Further, the image-reversal photoresist layer unexposed to light during the second exposure process maintains the characteristic of the original positive photoresist layer, and thus is removable during the second developing process performed after the entire surface exposure process.

Further, during the entire surface exposure process, an exposure energy can be adjusted such that the portion of the image-reversal photoresist layer, which is not exposed to the second exposure, is not completely removed by the second developing process but remains with a thickness thinner than that of the separator, to thereby be allowed to serve as an insulating layer for defining pixels.

Then, if the second developing process is performed, the portion of the photoresist layer exposed to light in the second exposures process are left and thus a negative-profile separator with an overhang structure is obtained. Further, the photoresist layer's portions not exposed to light are also left with its thickness reduced thinner than that of the separator, thus serving as an insulating layer for defining pixels. Subsequent processes for forming an organic light-emitting layer and a cathode layer are identical to those described in Reference 1 or 2, so detailed description thereof will be omitted.

The above-described method disclosed in Reference 3 has a merit in that an insulating layer and a separator can be formed by using an image-reversal photoresist layer of a single layer without having to use a high-price half tone mask with a design feature difficult to be fabricated. Therefore, by employing the method in Reference 3, some of the problems of Reference 2 can be solved.

Since, however, the method in Reference 3 also requires performing the exposure process and the developing process multiple times (3 times of exposure process and 2 times of developing process), the whole process for manufacturing an organic EL display is still complicated.

Moreover, there still exists the problem of Reference 2 that the portions of the image-reversal photoresist layer not exposed to light during the second exposure process, i.e., some of the edge portions of the insulating layer may not be completely cross-linked by the image-reversal baking and thus can be removed through the second developing process. That is to say, even in accordance with the method of Reference 3, a part of the edge portion of the insulating layer adjacent to pixels may be removed by being affected by the entire surface exposure and the second developing process, resulting in an increase of the inclined angle of the positive profile of the insulating layer close to a right angle. As a consequence, the thickness of an organic light-emitting layer near the edge portion of the insulating layer will be reduced during the subsequent processes for forming the organic light-emitting layer and the cathode layer, resulting in a short circuit between the cathode layer and the underneath anode layer.

SUMMARY OF THE INVENTION

It is, therefore, an object of the present invention to provide a method for manufacturing an organic electroluminescence display, capable of forming both an insulating layer and a separator by using a photoresist layer of a single layer through a simplified manufacturing process including only one developing process.

It is another object of the present invention to provide a method of manufacturing an organic electroluminescence display, capable of preventing a short circuit from being occurred between electrodes near edge portions of the insulating layer below the separator adjacent to pixels.

In accordance with a preferred embodiment of the present invention, there is provided a method for manufacturing an organic electroluminescence (EL) display, comprising the steps of: forming a plurality of first electrodes on a substrate in the shape of stripes; forming a photoresist layer on the entire surface of the substrate on which the plurality of first electrodes is formed, the photoresist layer being anyone selected from an image reversal photoresist layer and a positive photoresist layer; performing a first exposure of a first area on the photoresist layer, the first area crossing the plurality of first electrodes; carrying out an image reversal of the first exposed photoresist layer; performing a second exposure of a remaining area on the photoresist layer, the remaining area being except a second area crossing the plurality of first electrodes and a third area between the plurality of first electrodes; performing a third exposure of the entire surface of the photoresist layer; and developing the second exposed photoresist layer and the third exposed photoresist layer.

In accordance with another embodiment of the present invention, there is provided a method for manufacturing an organic electroluminescence (EL) display, comprising the steps of: forming a plurality of first electrodes on a substrate in the shape of stripes; forming an image reversal photoresist layer on the entire surface of the substrate on which the plurality of first electrodes is formed; performing a first exposure of a first area on the photoresist layer crossing the plurality of first electrodes; carrying out an image reversal of the first exposed photoresist layer; performing a second exposure of the entire surface of the image reversal photoresist layer; performing a third exposure of a remaining area on the photoresist layer except a second area crossing the plurality of first electrodes and a third area between the plurality of first electrodes; and developing the second exposed photoresist layer and the third exposed photoresist layer.

In accordance with further another embodiment of the present invention, there is provided a method for manufacturing an organic electroluminescence (EL) display device, comprising the steps of: forming a plurality of first electrodes on a substrate in the shape of stripes; forming an image reversal photoresist layer on the entire surface of the substrate on which the plurality of first electrodes is formed; performing a first exposure of a first area on the photoresist layer crossing the plurality of first electrodes; carrying out an image reversal of the first exposed image-reversal photoresist layer; performing a second exposure of the photoresist layer by using a half tone mask having a transflective area for defining a second area crossing the plurality of first electrodes and a third area between the plurality of first electrodes and a transmissive area for defining a remaining area except the first, the second and the third area; and developing the second exposed image reversal photoresist layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiment of the present invention will be described in detail with reference to the accompanying drawings.

In the drawings, thickness of various layers and regions therein are enlarged for the clear illustration thereof. Like reference numerals designate the same or corresponding parts in the various drawings.

A method for manufacturing an organic electroluminescence (EL) display will be explained in detail in accordance with preferred embodiments of the present invention in connection with the accompanying drawings.

Figure 1:
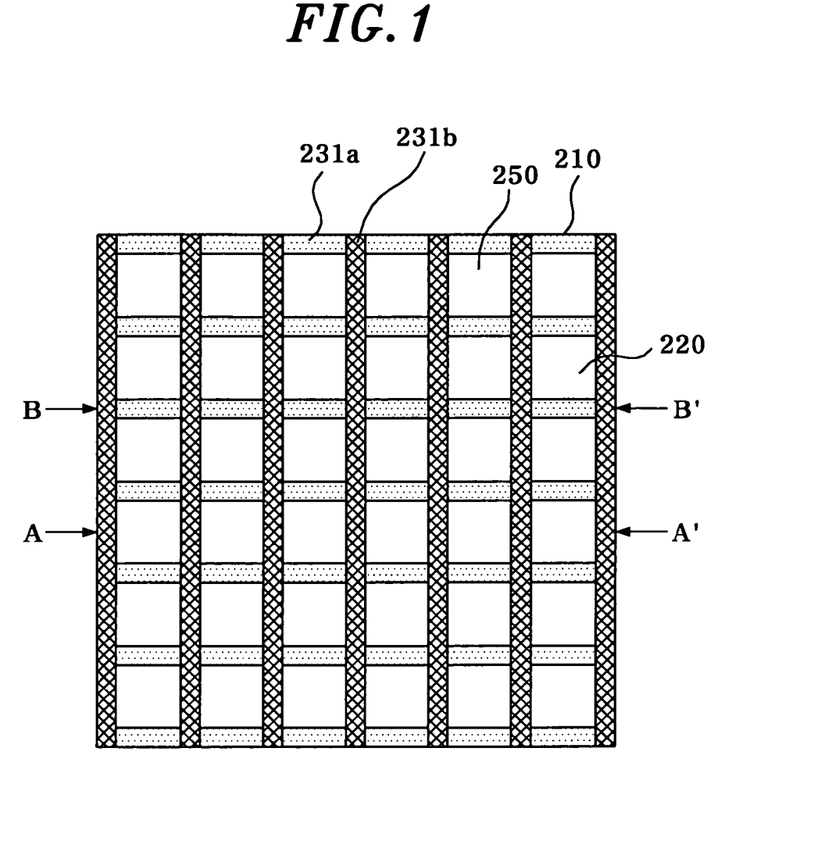
FIG. 1 is a plan view of an organic electroluminescence (EL) display in accordance with the present invention.

Referring to FIG. 1, there is shown an organic EL display fabricated in accordance with a first, a second or a third preferred embodiment of the present invention.

As shown in FIG. 1, a plurality of first electrodes 220, which are made of indium tin oxide (ITO), indium-doped zinc oxide (IZO or IXO), or the like, is patterned on a transparent substrate 210 in the shape of stripes. An insulating layer 231a of a lattice pattern is formed on the first electrodes 220 and the transparent substrate 210 in areas between neighboring first electrodes 220 and areas crossing the first electrodes 220. Further, separators 231b for use in patterning an organic light-emitting layer and second electrodes are formed on the insulating layer 231a crossing the first electrodes 220. The insulating layer 231a of the lattice pattern defines openings 250 that expose pixel regions on the first electrodes 220. The separators 231b serve to pattern the organic light-emitting layer and the second electrodes in pixels.

Further, an organic light-emitting layer (not shown) and second electrodes (not shown) are formed on the first electrodes 220 of the openings 250 in order.

A method for fabricating the organic EL display with the above-described configuration will now be described in accordance with a first preferred embodiment of the present invention.

FIGS. 2A to 2G show cross sectional views taken along a line A-A' of FIG. 1 to illustrate a process for manufacturing the organic EL display in accordance with the first preferred embodiment of the present invention, and FIGS. 3A to 3G provide cross sectional views taken along a line B-B' of FIG. 1 to describe the process for manufacturing the organic EL display in accordance with the first preferred embodiment of the present invention.

Figure 2A:
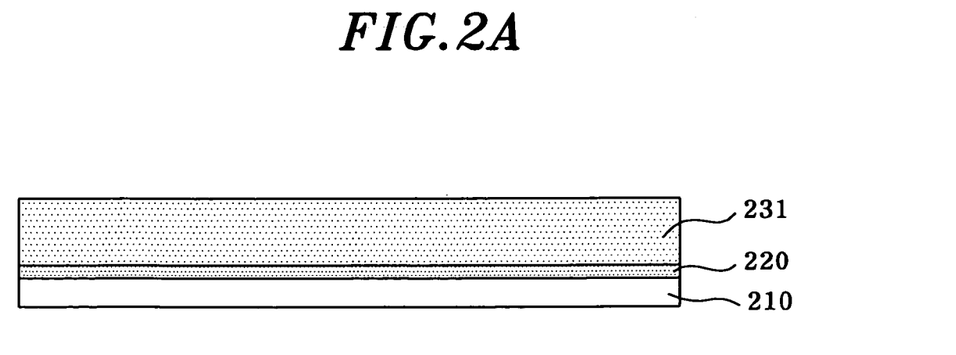
FIGS. 2A to 2G show cross sectional views taken along a line A-A' of FIG. 1 to illustrate a process for manufacturing an organic EL display in accordance with a first preferred embodiment of the present invention.
Figure 3A:
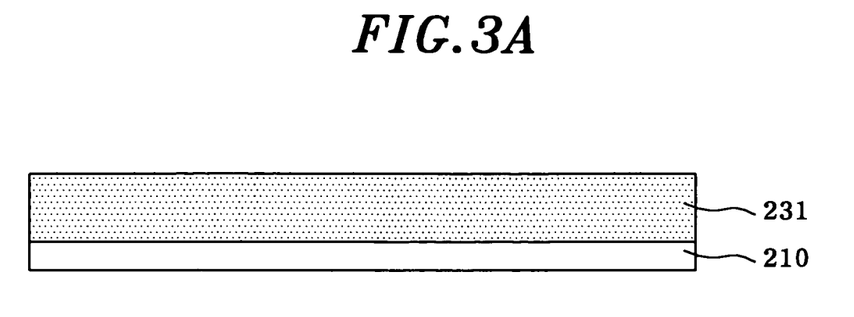
FIGS. 3A to 3G provide cross sectional views taken along a line B-B' of FIG. 1 to describe the process for manufacturing an organic EL display in accordance with the first preferred embodiment of the present invention.

In the manufacturing process of the organic EL display device in accordance with the first preferred embodiment, such a material for forming first electrodes as ITO, IZO (or IXO), or the like is deposited on the transparent substrate 210 made of transparent glass or plastic, wherein the thickness of the deposit ranges from about 1000 Å to 3000 Å. To be more specific, the material for the first electrodes is deposited on the cleaned transparent substrate 210 by a sputtering method, and the surface resistance of the deposited material is set to be not greater than 10 $\Omega/cm^2$. Also, by performing a photolithography process including an exposure and developing processes to a photoresist layer (not shown), the deposited material is patterned in the shape of stripes, thus obtaining first electrodes 220 as an anode layer.

Thereafter, an image reversal photoresist layer 231 is coated on the entire surface of the transparent substrate 210 on which the plurality of first electrodes 220 is formed in the strip shapes. Any of photoresist layers that are commonly used in the manufacturing process of semiconductors or various types of displays, e.g., AZ 5214E (commercially available from Clariant) can be employed as the image reversal photoresist layer 231. The following description will be provided for the case of utilizing the AZ 5214E as the image reversal photoresist layer. In such a case, the thickness of the image reversal photoresist layer 231 is preferably determined between 1 µm and 5 µm inclusive and, more preferably, between 3 µm and 5 µm inclusive.

Meanwhile, the image reversal photoresist layer 231 basically has a characteristic of a positive photoresist layer. However, if it is heat-treated at a preset temperature (for AZ5214E, at a temperature not smaller than 115° C.) after being exposed to light, the exposed portion of the image reversal photoresist layer 231 is undergone through an image reversal to have a characteristic of a negative photoresist layer (i.e., the exposed portion is cross-linked), and thus becomes to be insoluble in a developing solution.

After coating the image reversal photoresist layer 231, a pre-baking process is conducted at a temperature of 100° C. for a time period of about 60 seconds to dry the resultant structure. Thereafter, as can be seen from FIGS. 2B and 3B, first areas "L", which correspond to areas on the image reversal photoresist layer 231 crossing the first electrodes 220, is subjected to a first exposure process.

At this time, the first exposure process, i.e., a pre-exposure process for image-reversing the image reversal photoresist layer 231, is preferably carried out with an exposure energy of 20 to 60 mJ/cm². Further, the first areas L are transmitive areas which are reserved for overhang structured separators to be formed later. As described above, if the first exposure process is performed by using such an exposure mask having transmissive areas of the first areas L, the image reversal photoresist layer 231 corresponding to portions where the individual separators will be formed is entirely exposed, as can be seen from FIGS. 2B and 3B.

Figure 2B:
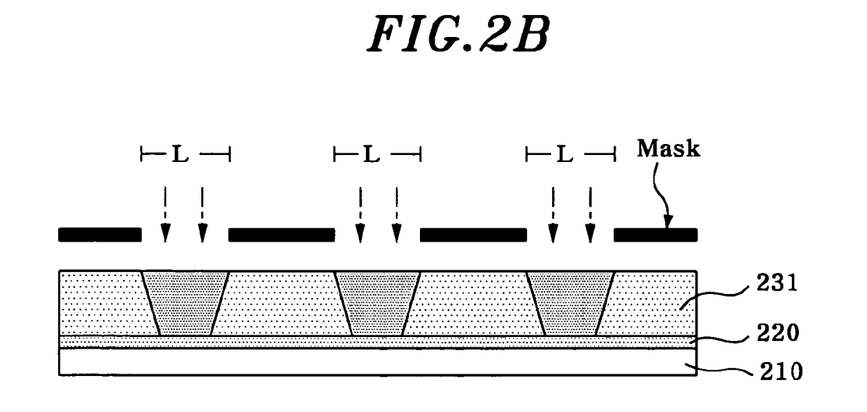
Figure 2C:
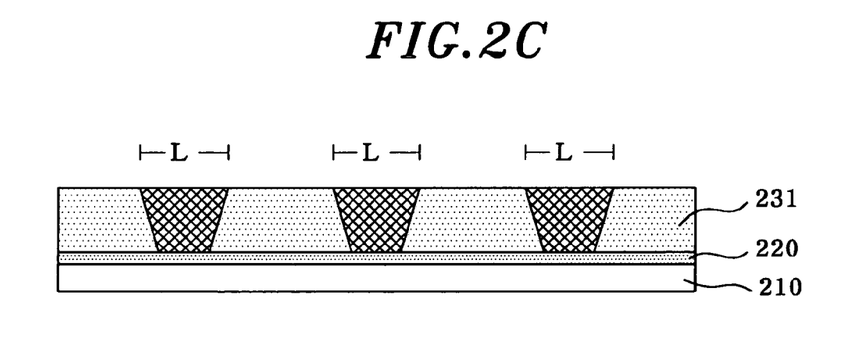
Figure 3B:
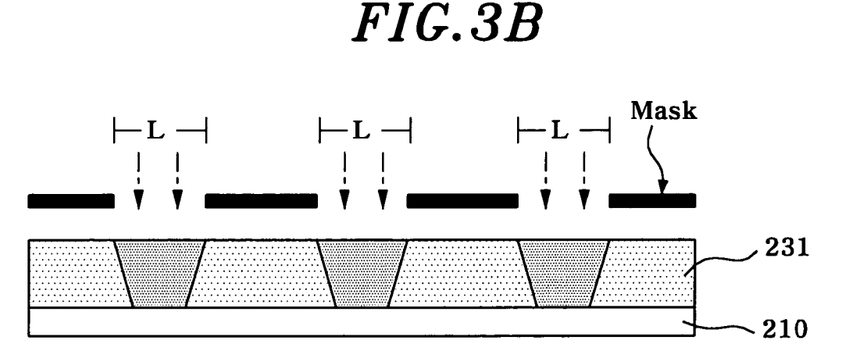
Figure 3C:
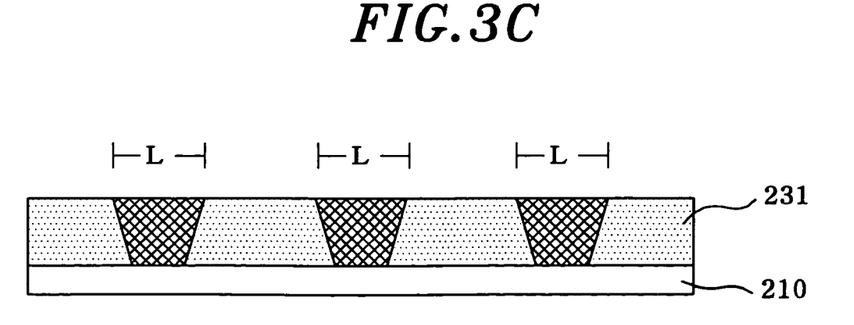

After the first exposure process is carried out, first exposure results are baked for 90 to 120 seconds at 115° C. to 125° C., as shown in FIGS. 2C and 3C, thereby image-reversing the image reversal photoresist layer 231. Once the image reversal baking process is performed, the first areas L, which is exposed by the first exposure process, on the image reversal photoresist layer 231 is cross-linked and thus becomes insoluble in a base developer, whereas the remaining areas on the image reversal photoresist layer 231 unexposed during the first exposure process maintains properties of a positive photoresist layer.

Figure 2D:
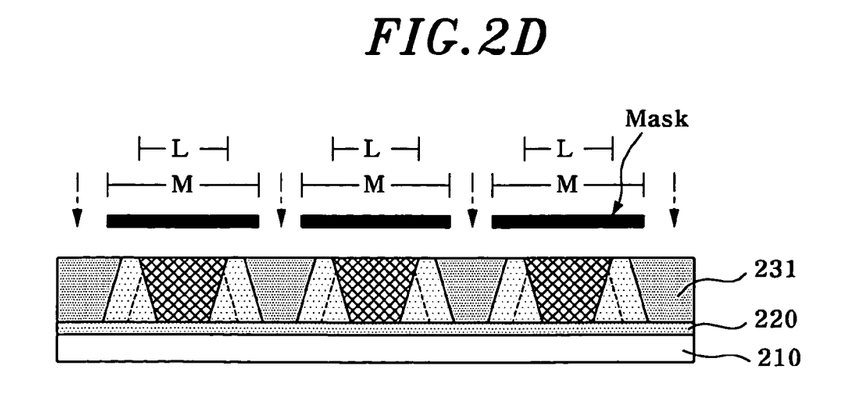
Figure 3D:
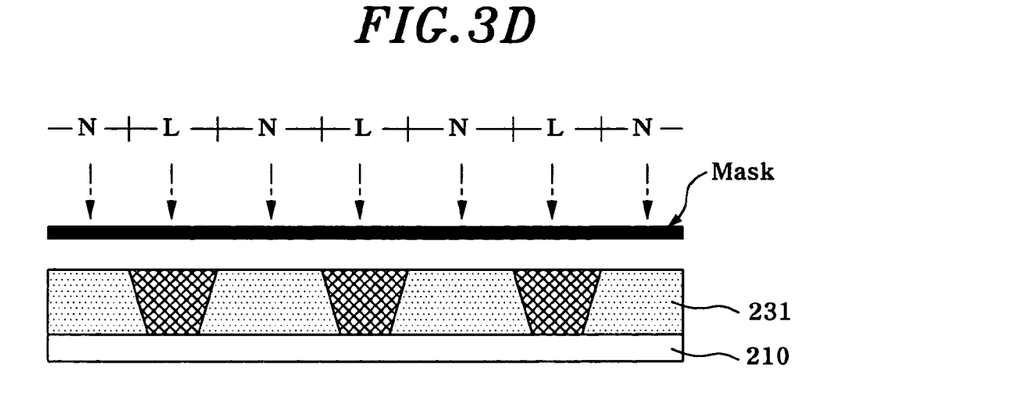

Meanwhile, after the image reversal baking process is carried out, a second exposure process is performed on remaining areas on the image reversal photoresist layer 231 except second areas M perpendicular to the first electrodes 220 and third areas N between the first electrodes 220, as illustrated in FIGS. 2D and 3D.

The second exposure process is performed to form lattice type insulating pattern for defining pixels to be formed later, wherein the second and the third areas M and N define an area where the insulating layer will be formed later. If the second exposure process is performed, as can be seen from FIGS. 2D and 3D, an unexposed image reversal photoresist layer 231 under the second and the third areas M and N serving as shield areas in the exposure mask has a positive profile in its sidewalls while maintaining the insoluble state in the base developer. Such positive profile forms a slant surface of the sidewalls of the insulating layers afterward.

In the second exposure process, a width of the second areas M is preferably greater than that of the first areas L serving as transmissive areas. Further, the exposure mask is preferably aligned so that a center of the second areas M coincides with that of the first areas L.

In other words, the second areas M define a portion where the insulating layers under the separators perpendicular to the first electrodes will be formed. If the second areas M have a width smaller than that of the first areas A for defining areas of the separators to be formed afterward, the insulating layers having a positive profile under the separators are formed considerably narrow or inappropriately formed later, as indicated by dotted lines in FIGS. 2D and 3D. Moreover, in case the centers of the first areas L do not coincide with those of the second areas M, the insulating layers under the separators may be asymmetrically formed afterward.

In the meantime, the second exposure process is preferably performed with exposure energy greater than 200 mJ/cm$^2$. In case the second exposure process is carried out with a smaller energy than that, it is difficult to sufficiently expose the remaining areas on the image reversal photoresist layer 231 except the second and the third areas M and N where the pixels will be formed. Accordingly, after a developing process is carried out later, a part of the image reversal photoresist layer may remain on the first electrodes 220 of openings 250 (see FIG. 1) for defining pixels.

If the second exposure process is performed as described above, the second and the third areas M and N on the image reversal photoresist layer 231 for defining the area of the insulating layers to be formed becomes insoluble in the base developer, whereas the remaining areas on the image reversal photoresist layer 231 except the second and the third areas M and N becomes soluble in the base developer and thus can be removed.

Figure 2E:
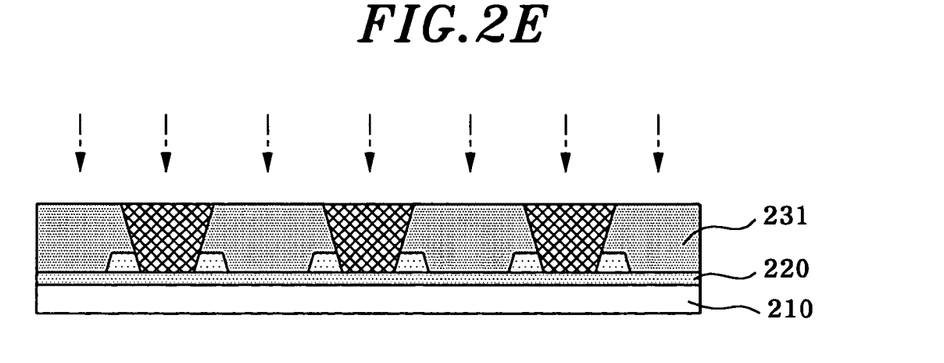
Figure 3E:
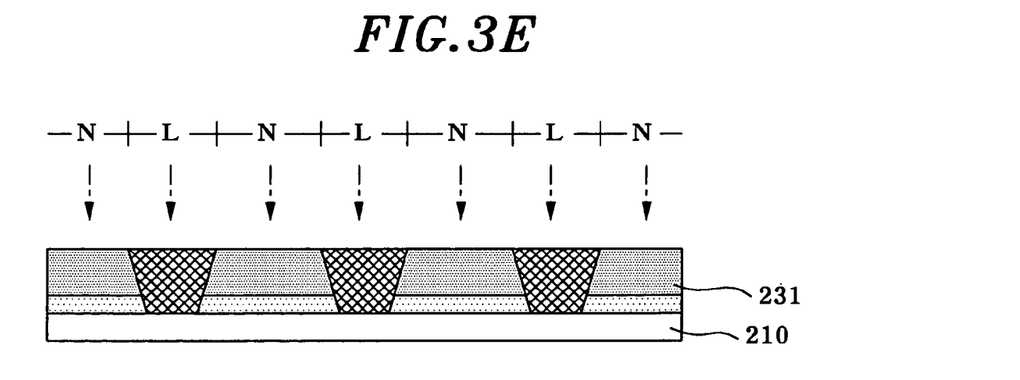

In the meantime, after the second exposure process is performed, as depicted in FIGS. 2E and 3E, a third exposure process (a flood exposure process) is performed on an entire surface of the image reversal photoresist layer 231 with an exposure energy of 100 to 200 mJ/cm$^2$, for example, by controlling an exposure dose.

If the third exposure process is performed, the first areas L on the image reversal photoresist layer 231 perpendicular to the first electrodes 220, which has been already image-reversed into an insoluble state in the developing solution, shows no change; whereas an upper partial portion of the image reversal photoresist layer 231, i.e., the second and the third areas M and N on the image reversal photoresist layer 231 becomes soluble in the base developer and thus can be removed by the third exposure process. At this time, by controlling the exposure dose of the third exposure process, an upper partial portion of the second and the third areas M and N on the image reversal photoresist layer 231 exclusively becomes soluble in the base developer later, whereas a remaining lower portion thereof is maintained by a certain thickness as a positive photoresist layer insoluble in the base developer.

Further, on the image reversal photoresist layer 231, the remaining areas except the first to the third areas L, M and N has been already image-reversed into a soluble state in the developing solution by the second exposure process.

Figure 2F:
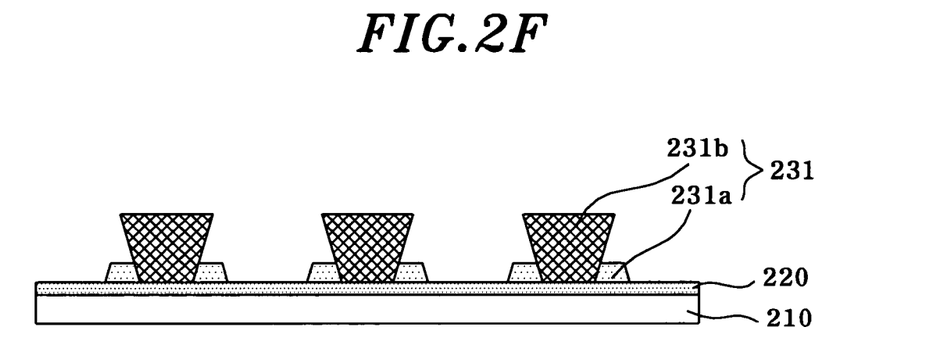
Figure 3F:
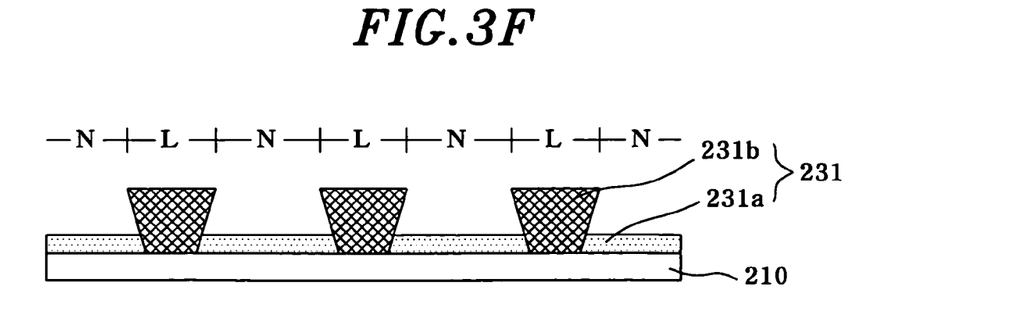

Next, as can be seen from FIGS. 2F and 3F, the third exposed image reversal photoresist layer 231 is developed by the base developer. By help of the developing process, the first areas L on the image reversal photoresist layer 231 remains as an overhang structure having a negative profile; a certain lower portion of the second and the third areas M and N on the image reversal photoresist layer 231 remains to have a positive profile by a certain thickness thereof; and a remaining image reversal photoresist layer 231 is dissolved in the base developer and then is removed.

As a result, on the image reversal photoresist layer 231, the first areas perpendicular to the first electrodes 220 becomes the separators 231b having the overhang structure, and the lower portions in the second areas perpendicular to the first electrodes 220 and in the third areas between the first electrodes 220 becomes the lattice type insulating layers 231a for defining the openings 250 in the pixel area to be formed.

Figure 2G:
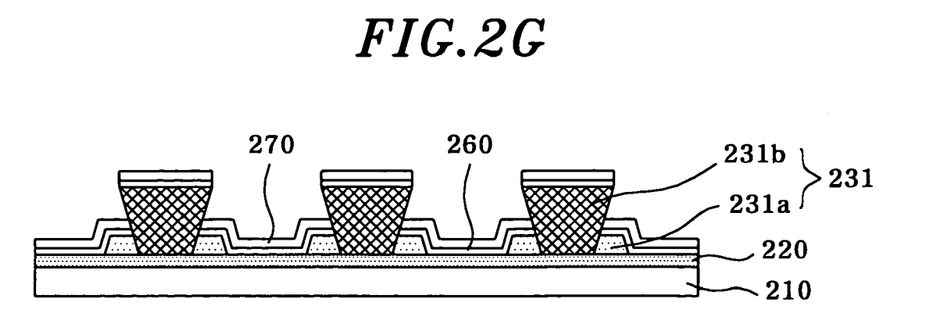
Figure 3G:
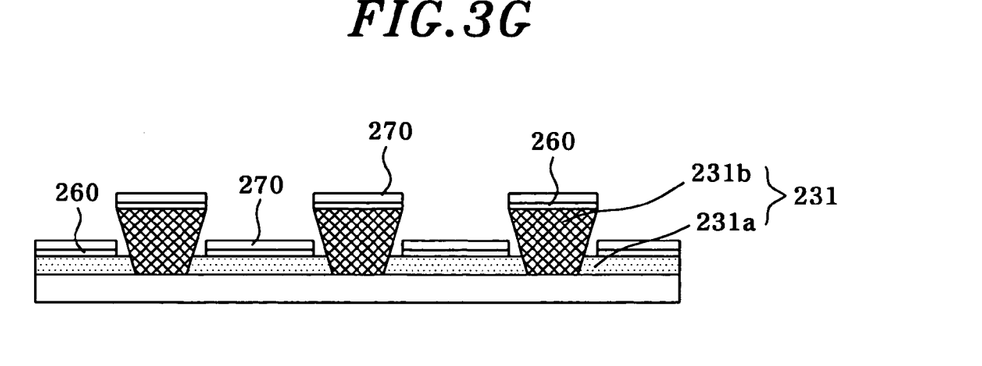

After the developing process is carried out, a dry process and a hard baking process are performed on a transparent substrate 210 and, then, an organic light-emitting layer 260 is deposited on the transparent substrate where the insulating layers 231a and the separators 231b are formed, as illustrated in FIGS. 2G and 3G.

The organic light-emitting layer 260 may be made of a low molecular fluorescent and phosphorescent organic light-emitting material, e.g., Alq$_3$, Anthrancene Ir(ppy)$_3$ or the like, or a polymeric light-emitting material, e.g., PPV (p-phenylenevinylene), PT (polythiophene) or the like and their derivatives. The low molecular based organic material is patterned with the use of a thermal evaporation in which a shadow mask is installed in a chamber, and the polymer based organic material is patterned by a spin coating, a transcription, an inkjet method.

In case of the low molecular based material, before the organic light-emitting layer 260 is formed, a hole-injecting layer and a hole-transporting layer may be sequentially formed. Further, an electron-transporting layer and an electron-injecting layer may be formed on the organic light-emitting layer. In case of using a hole-injection electrode having a high work function, the hole-injection layer serves as an organic thin film layer having properties capable of having massive holes injected thereinto and allowing the injected holes to move between layers, while preventing electrons from being injected, and hardly moving therein even if they are injected. Moreover, in case of using an electron-injection electrode having a low work function, the electron-transporting layer serves as an organic thin film layer having properties capable of having massive holes injected thereinto and allowing the injected holes to move therein, while making the injection of holes difficult, and hardly moving between layers even if they are injected therein. In case of using the low molecular based material, the hole-transporting layer is formed before being formed the organic light-emitting layer.

Thereafter, a second electrode 270 is formed as a cathode layer on the transparent substrate 210 having the organic light-emitting layer 260. The second electrode 270 is mainly made of a metal having an excellent electric conductivity such as Al, Li/Al, MgAg, Ca, or the like, and is deposited by a sputtering, an E-beam deposition, a thermal evaporation or the like.

Alternatively, in the fabricating method of the first preferred embodiment, the first exposure process may be performed by using an exposure mask having a shield area at a central portion of a first area on the image reversal photoresist layer and a transmissive area at a peripheral portion of the shield area, instead of using an exposure mask having a transmissive area corresponding to a first area on the image reversal photoresist layer.

Figure 4A:
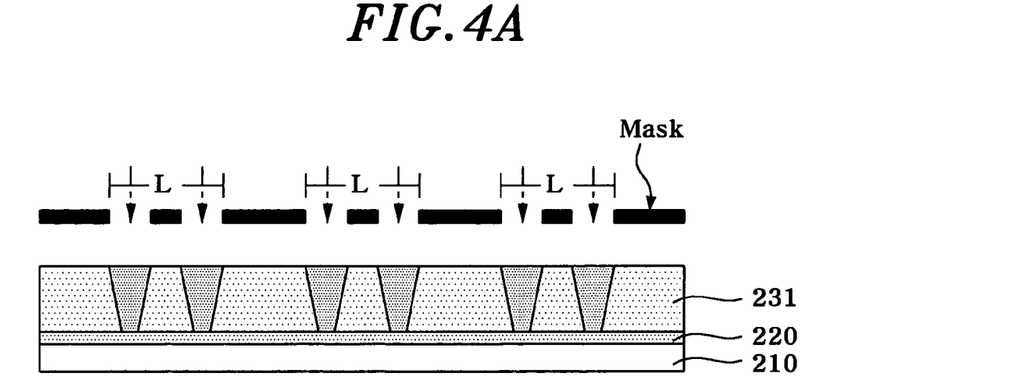
FIGS. 4A and 4B set forth cross sectional views taken along a line A-A' of FIG. 1 to describe a different way of performing a first exposure step in the process for manufacturing an organic EL display in accordance with the first preferred embodiment of the present invention.
Figure 5A:
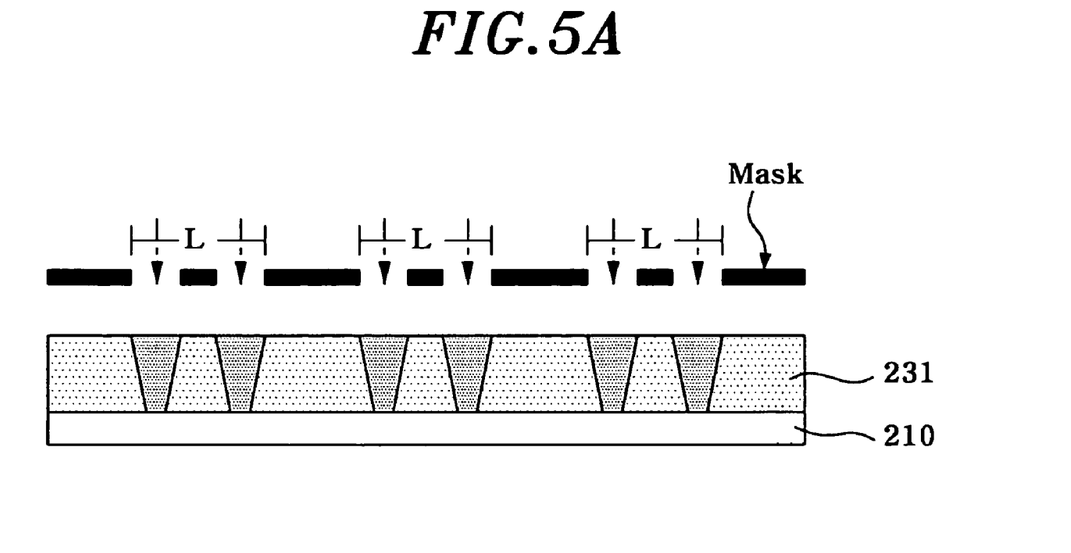
FIGS. 5A and 5B present cross sectional views taken along a line B-B' of FIG. 1 to describe the different way of performing the first exposure step in the process for manufacturing an organic EL display in accordance with the first preferred embodiment of the present invention.

FIGS. 4A and 5A provide cross sectional views to explain the first exposure process in the fabricating method of an organic EL display in accordance with the first preferred embodiment. FIG. 4A is a cross sectional view taken along line A-A' of FIG. 1, and FIG. 5A is a cross sectional view taken along line B-B' of FIG. 1.

Figure 4B:
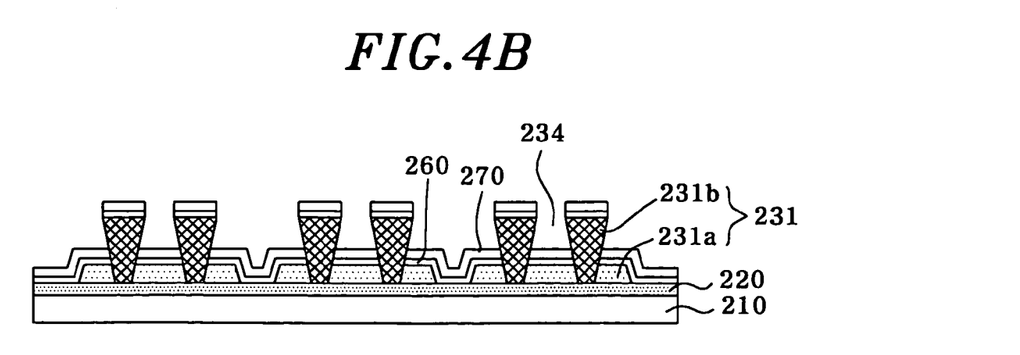
Figure 5B:
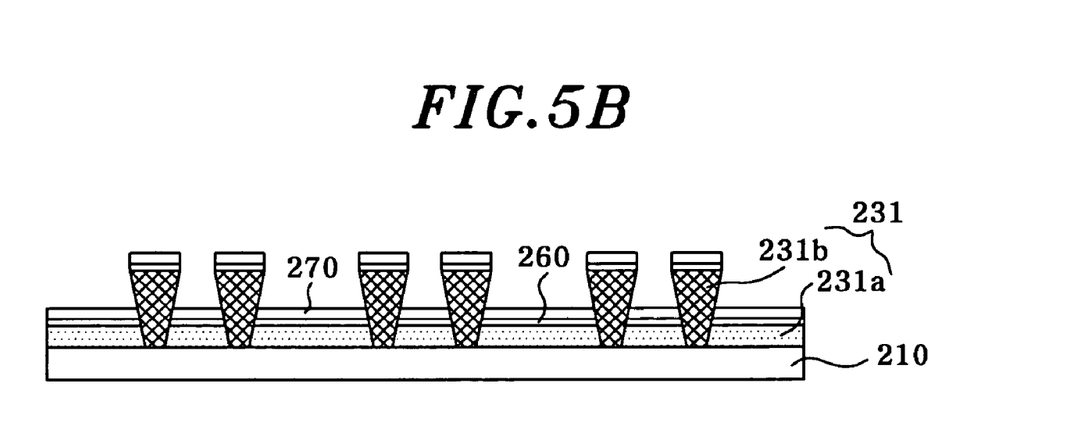

Further, FIGS. 4B and 5B present cross sectional views of the organic EL display completed by performing the first exposure process. FIG. 4B shows a cross sectional view taken along line A-A' of FIG. 1, and FIG. 5B depicts a cross sectional view taken along line B-B' of FIG. 1.

If the first exposure process, as in FIGS. 4A and 5A, is performed by using the exposure mask having the shield area at the central portion in the first areas L and the transmissive area at the peripheral portion of the shield area, trenches 234 perpendicular to the first electrodes 220 are formed on an area on the image reversal photoresist layer 231 corresponding the shield area. That is, if the first exposure process is performed as described above and, then, if post processes are carried out as shown in FIGS. 2G and 3C to 3G, the trenches 234 perpendicular to the first electrodes 220, after the developing process, are formed in the overhang structure on the image reversal photoresist layer 231 corresponding to the shield areas among the first areas, the trenches serving to separate adjacent pixels from each other, as shown in FIGS. 4B and 5B.

In forming the trenches 234, in order to prevent a short-circuit between the adjacent pixels, a depth of the trenches 234 needs to be greater than a deposition thickness of the organic light-emitting layer 260 and the second electrodes 270. More specifically, the depth is preferably greater than a sum of thicknesses of the organic light-emitting layer 260 and the second electrodes 270 by about 1.5 to 15 times (or 0.5 μm to 4.5 μm), more preferably 7 to 14 times (or 2 μm to 4 μm).

In accordance with the first preferred embodiment of the present invention, it is possible to simultaneously form the insulating layers 231a and the separators 231b by using a single image reversal photoresist layer. Further, the first preferred embodiment of the present invention, which includes a single developing process, can manufacture an organic EL display with more simplified processes compared to the prior arts requiring at least two or more developing processes.

In the prior arts, the end portions of the insulating layers under the separators adjacent to the pixels are damaged during the second developing process, thereby causing the short-circuit between the electrodes adjacent thereto. However, in the first preferred embodiment of the present invention, since a single developing process is performed, the end portions of the insulating layers are free from damages. Accordingly, an inclined angle of the positive profile of the insulating layers does not become steep, thereby enabling to prevent the short-circuit between the electrodes.

Hereinafter, a fabricating method of an organic EL display in accordance with a second preferred embodiment of the present invention will be described.

The fabricating method of the second preferred embodiment is mostly identical to that of the first preferred embodiment except that the second exposure process and the third exposure process of the first preferred embodiment are carried out in a reverse sequence. Therefore, hereinafter, only differences between the first and the second preferred embodiment will be described with reference to FIGS. 2A to 5B.

In fabricating the organic EL display in accordance with the second preferred embodiment, the processes of the first preferred embodiment are equally performed from a process for forming first electrodes 220 shown in FIGS. 2A and 3A to an image reversal process shown in FIGS. 2C and 3C. Then, a second exposure process is performed in the same manner of the third exposure process performed in the first preferred embodiment, i.e., the flood exposure process. In this regard, specific procedures or conditions of the second exposure process are identical to those of the third exposure process of the first preferred embodiment.

If the second exposure process (the flood exposure process) is performed, an upper partial portion of the image reversal photoresist layer 231 in remaining areas except the first areas where the separators 231b will be formed later becomes soluble in a base developer afterward, whereas a lower portion of the image reversal photoresist layer 231 by a certain thickness is maintained as a positive photoresist layer insoluble in the developing solution.

Thereafter, a third exposure process is carried out in the same manner of the second exposure process of the first preferred embodiment. In other words, during the third exposure process, the remaining areas on the image reversal photoresist layer 231 except the second areas M perpendicular to the first electrodes 220 and the third areas N between the first electrodes 220 is exposed.

After the third exposure process is performed, as same as the processes of the first preferred embodiment are performed up to the third exposure process (see FIGS. 2E and 3E), the first areas L on the image reversal photoresist layer 231 where the separators 231b will be formed has been already changed into an insoluble state in a basic developing process by the first exposure process and the image reversal process; a lower portion of the second and the third areas M and N on the image reversal photoresist layer 231 where the insulating layer 231a will be formed is unexposed by a certain thickness and thus insoluble in the base developer; and the remaining areas on the image reversal photoresist layer 231 of becomes soluble in the base developer by the second and the third exposure process.

Thereafter, by performing post processes identical to those of the first preferred embodiment shown in FIGS. 2F to 2G, and FIGS. 3F to 3G, the insulating layers 231a for defining pixels and the separators 231b for patterning the second electrode are formed and, further, the organic light-emitting layer 260 and the second electrode 270 are formed, as illustrated in FIGS. 2G and 3G. Accordingly, a resultant organic EL display is completed.

Further, also in the second preferred embodiment, as shown in FIGS. 4A to 4B, and FIGS. 5A to 5B of the first preferred embodiment, the first exposure may be carried out by using an exposure mask having a shield area at a central portion and a transmissive area at a peripheral portion of the shield area in the first area L, instead of using an exposure mask having a transmissive area of a first area L.

As a result, after the developing process is performed, as depicted in FIGS. 4B and 5B of the first preferred embodiment, trenches 234 perpendicular to the first electrodes 220 are formed on the image reversal photoresist layer 231 corresponding to the shield areas. Especially, such trenches 234 are formed in the overhang structure enabling adjacent pixels to be separated from each other.

Moreover, in forming the trenches 234, in order to prevent a short-circuit between the adjacent pixels, a depth of the trenches 234 needs to be greater than a deposition thickness of the organic light-emitting layer 260 and the second electrodes 270. More specifically, the depth is preferably greater than a sum of thicknesses of the organic light-emitting layer and the second electrode by about 1.5 to 15 times (or 0.5 μm to 4.5 μm), more preferably 7 to 14 times (or 2 μm to 4 μm).

In accordance with the second preferred embodiment of the present invention, it is also possible to simultaneously form the insulating layers 231*a* and the separators 231*b* by using a single image reversal photoresist layer. Further, the second preferred embodiment of the present invention, which includes a single developing process, can manufacture an organic EL display with more simplified processes compared to the prior arts requiring at least two times developing processes.

In the prior arts, the end portions of the insulating layers under the separators adjacent to the pixels are damaged during the second developing process and, thus, an inclined angle of the positive profile of the insulating layers becomes as steep as possible, thereby causing the short-circuit between the electrodes near the end portions of the insulating layers. However, the second preferred embodiment of the present invention can solve those drawbacks of the prior arts.

Hereinafter, a fabricating method of an organic EL display in accordance with a third preferred embodiment of the present invention will be described.

The fabricating method in accordance with the third preferred embodiment is mostly identical to that of the first preferred embodiment except that a positive photoresist layer is formed instead of the image reversal photoresist layer dedicated in the first preferred embodiment and changes its property into that of the image reversal photoresist layer later. Hereinafter, only differences between the first and the third preferred embodiments will be described with reference to FIGS. 2A to 5B of the first preferred embodiment.

In fabricating the organic EL display in accordance with the third preferred embodiment, first of all, as in the first preferred embodiment, a plurality of strip-shaped first electrodes 220 are formed on a transparent substrate 210, as shown in FIGS. 2A and 3A. A material forming the first electrodes 220, a deposition method and a patterning method thereof are also identical to those of the first preferred embodiment.

Next, a general positive photoresist layer 231 is coated, instead of the image reversal photoresist layer of the first preferred embodiment, on the transparent substrate 210 where the first electrodes 220 are patterned. As for the positive photoresist layer 231, a general positive photoresist layer for use in manufacturing semiconductor devices and various displays may be used. In addition, the positive photoresist layer 231 as well as the image reversal photoresist layer of the first preferred embodiment is preferably coated with a thickness of 1 μm to 5 μm and, more preferably, 3 μm to 5 μm.

Thereafter, as shown in FIGS. 2B and 3B of the first preferred embodiment, a first exposure process is performed on the first areas L on the positive photoresist layer 231 perpendicular to the first electrodes 220 and, then, an image reversal catalyst containing an amine group is diffused into the positive photoresist layer 231 exposed by the first exposure process.

As for the image reversal catalyst containing an amine group, there can be used a general image reversal catalyst for use in changing a general positive photoresist layer into an image reversal photoresist layer. However, it is more preferable to use an image reversal catalyst containing one or more materials selected among imidazole, monazoline, triethanol amine and ammonia.

If such image reversal catalyst is diffused into the first exposed positive photoresist layer 231 and, then, a heat treatment is performed at a certain temperature, the first exposed positive photoresist layer 231 becomes insoluble in a base developer.

If the process for diffusing the image reversal catalyst is performed and, then, post processes identical to those of the first preferred embodiment illustrated in FIGS. 2C to 2G and 3C to 3G are performed, insulating layers 231*a* for defining pixels and separators 231*b* for patterning second electrodes are formed and, further, an organic light-emitting layer 260 and the second electrode 270 are formed, as shown in FIGS. 2G and 3G. Consequently, a resultant organic EL display is completed.

Besides, as in the third preferred embodiment, as shown in FIGS. 4A to 4B, and FIGS. 5A to 5B of the first preferred embodiment, the first exposure process may be carried out by using an exposure mask having a shield area at a central portion in the first areas L and a transmitive area provided at a peripheral portion of the shield area, instead of using an exposure mask having a transmissive area corresponding to the first areas L.

As a result, after the developing process is performed, as depicted in FIGS. 4B and 5B of the first preferred embodiment, trenches 234 perpendicular to the first electrodes 220 are formed on the positive photoresist layer 231 corresponding to the shield areas. Especially, such trenches 234 are formed in the overhang structure enabling the adjacent pixels to be separated from each other.

Moreover, in forming the trenches 234 for separating the adjacent pixels, in order to prevent a short-circuit between the adjacent pixels, a depth of the trenches 234 needs to be greater than a deposition thickness of the organic light-emitting layer 260 and the second electrodes 270. To be specific, the depth is preferably greater than a sum of a thickness of the organic light-emitting layer 260 and the second electrodes 270 by about 1.5 to 15 times, more preferably 7 to 14 times.

In accordance with the third preferred embodiment of the present invention, it is also possible to simultaneously form the insulating layers 231*a* and the separators 231*b* by using a single image reversal photoresist layer. Further, the third preferred embodiment of the present invention, which includes a single developing process, can manufacture an organic EL display with more simplified processes compared to the prior arts requiring at least two developing processes.

In the prior arts, the end portions of the insulating layers under the separators adjacent to the pixels are damaged during the second developing process and, thus, an inclined angle of the positive profile of the insulating layers becomes as steep as possible, thereby causing the short-circuit between the electrodes near the end portions of the insulating layers. However, the third preferred embodiment of the present invention can solve those drawbacks of the prior arts.

Hereinafter, a fabricating method of an organic EL display in accordance with a fourth preferred embodiment of the present invention will be described.

The fabricating method in accordance with the fourth preferred embodiment is mostly identical to that of the first preferred embodiment except that a single second exposure process using a halftone mask is performed instead of the second and the third (flood exposure) process of the first preferred embodiment. Hereinafter, only differences between the first and the fourth preferred embodiment will be described with reference to FIGS. 2A to 5B as in the first preferred embodiment.

In fabricating the organic EL display in accordance with the fourth preferred embodiment, the processes of the first preferred embodiment are equally performed from a process for forming the first electrodes on the transparent substrate shown in FIGS. 2A and 3A to a process for image-reversing the image reversal photoresist layer exposed by the first exposure process shown in FIGS. 2C and 3C. Here, specific processes of the first preferred embodiment as shown in FIGS. 2A to 2C, and FIGS. 3A to 3C can be equally applied to the fourth preferred embodiment.

Thereafter, instead of the second and the third exposure (the flood exposure) process of the first preferred embodiment, a second exposure process is carried out by using a halftone mask having a transflective area for defining a second area perpendicular to a first electrode and a third area between the first electrode and a transparent area for defining a remaining area except the first, the second, and the third areas.

Once the second exposure process (i.e., a halftone exposure process) is carried out, as shown in FIGS. 2E and 3E, the first areas L on the image reversal photoresist layer 231 perpendicular to the first electrodes 220, which has been already image-reversed into an insoluble state in the developing solution, shows no change. Further, since the second and the third areas M and N on the image reversal photoresist layer 231 are exposed through a halftone pattern of the halftone mask, an upper portion of the image reversal photoresist layer 231 becomes soluble in the base developer and thus can be removed. Furthermore, a remainder, i.e., a lower portion of the image reversal photoresist layer 231 is maintained by a certain thickness as a positive photoresist layer insoluble in the developing solution.

Areas on the image reversal photoresist layer 231 except the first to the third areas L to N are subject to a second exposure through a normal tone pattern and thus become soluble in the base developer.

Thereafter, as can be seen from FIGS. 2F and 3F, the exposed image reversal photoresist layer is developed by the base developer. By performing the developing process, as in the first preferred embodiment, the first areas L on the image reversal photoresist layer 231 remain to have the overhang structure of a negative profile; a lower portion of the second and the third areas M and N on the image reversal photoresist layer 231 remains to have a positive profile in a certain thickness thereof; and a remaining portion of the image reversal photoresist layer 231 dissolves in the developing solution and then is removed.

As a result, on the image reversal photoresist layer the first areas L perpendicular to the first electrodes 220 becomes the separators 231b with the overhang structure, and the low portion of the second areas M perpendicular to the first electrodes 220 and the third areas N between the first electrodes 220 becomes lattice type insulating layers 231a with a certain thickness for defining openings 250 of a pixel forming area.

After the insulating layers 231a and the separators 231b are formed as described above, an organic light-emitting layer 260 and a second electrode 270 are formed in the same manner of the first preferred embodiment, thereby completing a resultant organic EL display, as shown in FIGS. 2G and 3G.

Also in the fourth preferred embodiment, as depicted in FIGS. 4A to 4B, and FIGS. 5A to 5B of the first preferred embodiment, the first exposure process may be performed by using an exposure mask having a shield area at a central portion in a first area L and a transmissive area provided at a peripheral portion of the shield area, instead of using an exposure mask having a transmissive area corresponding to a first area L on an image reversal photoresist layer 231.

As a result, after the developing process is performed, as depicted in FIGS. 4B and 5B of the first preferred embodiment, trenches 234 perpendicular to the first electrodes 220 are formed on the image reversal photoresist layer 231 corresponding to the shield areas. Especially, such trenches 234 are formed in the overhang structure enabling the adjacent pixels to be separated from each other.

Moreover, in forming the trenches 234, in order to prevent a short-circuit between the adjacent pixels, a depth of the trenches 234 needs to be greater than a deposition thickness of the organic light-emitting layer and the second electrode. To be specific, the depth is preferably greater than a sum of thicknesses of the organic light-emitting layer and the second electrode by about 1.5 to 15 times, more preferably 7 to 14 times.

In accordance with the fourth preferred embodiment of the present invention, it is also possible to simultaneously form the insulating layers 231a and the separators 231b by using a single image reversal photoresist layer. Further, the fourth preferred embodiment of the present invention, which includes a single developing process, can manufacture an organic EL display with more simplified processes compared to the prior arts requiring at least two times of developing processes.

In particular, in comparison with the first to third preferred embodiments, it is more difficult to design and manufacture the halftone mask used in the fourth preferred embodiment than a general exposure mask. However, in the fourth preferred embodiment, the second and the third exposure process are performed at once, so that the processes can be simplified compared to the first to the third preferred embodiment. Further, since the fourth preferred embodiment uses a 2-Tone halftone mask having a transflective area and a transparent area, not a 3-tone halftone mask having a perfect shield area, a transflective area (a partial shield area) and a transparent area, it is possible to easily design and manufacture the halftone mask compared to the prior art (see Reference 2). Especially, if the 2-tone halftone mask is used, the second and the third exposure process of the first to the third preferred embodiment can be performed at once, which more simplifies the processes.

In the prior arts, the end portions of the insulating layers under the separators adjacent to the pixels are damaged during the second developing process and, thus, an inclined angle of the positive profile of the insulating layers becomes as steep as possible, thereby causing the short-circuit between the electrodes near the end portions of the insulating layers. However, the fourth preferred embodiment of the present invention can solve those drawbacks of the prior arts.

In accordance with the present invention, since the insulating layers and the separators can be simultaneously formed by using the single image reversal photoresist layer or positive photoresist layer, an adhesive problem between the insulating layers and the separators is not generated. Further, the present invention including a single developing process can manufacture an organic EL display having the insulating layers and the separators with more simplified processes compared to the prior arts requiring at least two developing processes. Especially, if the 2-tone halftone mask is used, the exposure processes can be reduced to two processes.

In the prior arts, the end portions of the insulating layers under the separators adjacent to the pixels are damaged during the second developing process and, thus, an inclined angle of the positive profile of the insulating layers becomes as steep as possible, thereby causing the short-circuit between the electrodes near the end portions of the insulating layers. On the other hand, in the fabricating method of the present invention, the insulating layers having a positive profile and the overhang structured separators having a negative profile can be simultaneously formed by the single developing process, so that the drawbacks of the prior arts can be solved.

In the present invention, the single developing process is performed after the three exposure processes and the heat treatment process. Therefore, in comparison with the prior arts, it is possible to make an arrangement of in-line equipments compact and greatly reduce a processing time, an equipment vestment and a capacity, which is useful for a mass production. Moreover, since moisture is fatal to a reliability of the organic EL display, a possibility of adsorbing and containing moisture therein needs to be minimized by minimizing the number of developing processes.

While the invention has been shown and described with respect to the preferred embodiments, it will be understood by those skilled in the art that various changes and modification may be made without departing from the scope of the invention as defined in the following claims.

What is claimed is:

1. A method for manufacturing an organic electroluminescence display, comprising the steps of:
   (a) forming a plurality of first electrodes on a substrate in the shape of stripes;
   (b) forming a photoresist layer on the entire surface of the substrate on which the plurality of first electrodes is formed;
   (c) performing a first exposure of a first area on the photoresist layer, the first area crossing the plurality of first electrodes;
   (d) carrying out an image reversal of the exposed photoresist layer by the first exposure step (c);
   (e) performing a second exposure of a remaining area on the photoresist layer, the remaining area being except a second area crossing the first electrodes and a third area between the first electrodes;
   (f) performing a third exposure of the entire surface of the photoresist layer; and
   (g) developing the exposed photoresist layer by the second exposure step (e) and the exposed photoresist layer by third exposure step (f).

2. The method of claim 1, further comprising the step of forming an organic light-emitting layer and a plurality of second electrodes in order on the first electrodes after the developing step (g).

3. The method of claim 2, wherein the first exposure step (c) includes exposing the first area on the photoresist layer by using an exposure mask having a transmissive area corresponding to the first area.

4. The method of claim 3, wherein the second exposure step (e) is performed by using an exposure mask having a lattice pattern, the exposure mask having a shield area corresponding to the second area and the third area on the photoresist layer, the width of the second area being larger than that of the first area.

5. The method of claim 4, wherein the exposure mask is aligned such that a center of the second area shielded in the second exposure step coincides with a center of the first area.

6. The method of claim 2, wherein the first exposure step (c) includes exposing the first area on the photoresist layer by using an exposure mask having a shield area at a central portion of the first area and a transmissive area at a peripheral portion of the first area.

7. The method of claim 6, wherein a trench are formed on the photoresist layer corresponding to the shield area of the exposure mask during the developing step (g), the trench being crossed with the first electrodes, and wherein the depth of the trench is set to be about 1.5 to 15 times the sum of the thicknesses of the organic light-emitting layer and the second electrode.

8. The method of claim 6, wherein the second exposure step (e) is performed by using an exposure mask having a lattice pattern, the exposure mask having a shield area corresponding to the second area and the third area on the photoresist layer, the width of the second area being larger than that of the first area.

9. The method of claim 8, wherein the exposure mask is aligned such that a center of the second area shielded in the second exposure step coincides with a center of the first area.

10. The method of claim 1, wherein the photoresist layer includes an image reversal photoresist layer; and wherein the image reversal step (d) includes:
    heat-treating the exposed photoresist layer by the first exposure step (c).

11. The method of claim 1, wherein the photoresist layer includes a positive photoresist layer; and
    wherein the image reversal step (d) includes the steps of:
    diffusing an image reversal catalyst containing amine group to the exposed photoresist layer by the first exposure step (c) and;
    heat-treating the exposed photoresist layer by the first exposure step (c).

12. A method for manufacturing an organic electroluminescence display, comprising the steps of:
    (a) forming a plurality of first electrodes on a substrate in the shape of stripes;
    (b) forming a photoresist layer on the entire surface of the substrate on which the plurality of first electrodes is formed, wherein the photoresist layer includes an image reversal photoresist layer;
    (c) performing a first exposure of a first area on the photoresist layer crossing the first electrodes;
    (d) carrying out an image reversal of the photoresist layer exposed by the first exposure step (c);
    (e) performing a second exposure of the entire surface of the photoresist layer;
    (f) performing a third exposure of a remaining area on the photoresist layer except a second area crossing the first electrodes and a third area between the first electrodes; and
    (g) developing the photoresist layer exposed by the second exposure (e) and the photoresist layer exposed by the third exposure step (f).

13. A method for manufacturing an organic electroluminescence display device, comprising the steps of:
    (a) forming a plurality of first electrodes on a substrate in the shape of stripes;
    (b) forming a photoresist layer on the entire surface of the substrate on which the first electrodes is formed, wherein the photoresist layer includes an image reversal photoresist layer;
    (c) performing a first exposure of a first area on the photoresist layer crossing the first electrodes;
    (d) carrying out an image reversal of the photoresist layer exposed by the first exposure step (c);
    (e) performing a second exposure of the photoresist layer by using a half tone mask having a transflective area for defining a second area crossing the first electrodes and a third area between the first electrodes and a transmissive area for defining a remaining area except the first, the second and the third area; and (f) developing the photoresist layer exposed by the second exposure step(c).

14. The method of claim 13, further comprising the step of forming an organic light-emitting layer and a second electrode in order on the first electrodes after the developing step (f).

15. The method of claim 14, wherein the first exposure step (c) is performed upon the first area on the photoresist layer by using an exposure mask having a transmissive area corresponding to the first area.

16. The method of claim 15, wherein the second exposure step (e) is performed by using a half tone mask having a lattice pattern, the half tone mask further having a transflective area corresponding to the second area and the third area on the photoresist layer, the width of the second area being larger than that of the first area.

17. The method of claim 16, wherein the half tone mask is aligned such that a center of the second area of the transflective area during the second exposure step coincides with a center of the first area on the photoresist layer.

18. The method of claim 14, wherein the first exposure step (c) is performed upon the photoresist layer on the first area by using an exposure mask having a shield area at a central portion of the first area and a transmissive area at the peripheral portion of the first area.

19. The method of claim 18, wherein a trench is formed on the photoresist layer corresponding to the shield area of the exposure mask during the developing step (f), the trench being crossed with the first electrodes; and wherein the depth of the trench is set to be 1.5 to 15 times the sum of the thicknesses of the organic light-emitting layer and the second electrode.

20. The method of claim 18, wherein the second exposure step is performed by using a half tone mask having a lattice pattern, the half tone mask having a transflective area corresponding to the second area and the third area on the photoresist layer, the width of the second area being larger than that of the first area.

21. The method of claim 13, wherein the image reversal step (d) includes a step for heat-treating the photoresist layer exposed by the first exposure step (c).

* * * * *